United States Patent
Vallet et al.

(10) Patent No.: US 7,391,220 B2
(45) Date of Patent: Jun. 24, 2008

(54) METHOD AND DEVICE FOR DETECTING DEFECTS OF ELECTROMAGNETIC PROTECTION FOR ELECTRIC HARNESSES

(75) Inventors: Serge Vallet, Cavaillon (FR); Michel Tholomier, Fuveau (FR); Jean-Pierre Derain, Mallemort (FR); Jean Duveau, Carnoux (FR)

(73) Assignees: Eurocopter, Marignane Cedex (FR); Universite Paul Cezanne Aix-Marseille III, Aix en Provence Cedex (FR)

( * ) Notice: Subject to any disclaimer, the term of this patent is extended or adjusted under 35 U.S.C. 154(b) by 46 days.

(21) Appl. No.: 10/571,601

(22) PCT Filed: Sep. 7, 2004

(86) PCT No.: PCT/FR2004/002262

§ 371 (c)(1),
(2), (4) Date: Mar. 10, 2006

(87) PCT Pub. No.: WO2005/026752

PCT Pub. Date: Mar. 24, 2005

(65) Prior Publication Data

US 2007/0036081 A1    Feb. 15, 2007

(30) Foreign Application Priority Data

Sep. 11, 2003    (FR) .................................. 03 10683

(51) Int. Cl.
G01R 31/02    (2006.01)
G01K 13/02    (2006.01)
H01B 7/18    (2006.01)

(52) U.S. Cl. ................. 324/539; 324/543; 374/137; 174/104

(58) Field of Classification Search .......... 324/539, 324/543, 627; 174/104, 393; 374/137
See application file for complete search history.

(56) References Cited

U.S. PATENT DOCUMENTS 3,746,582 A * 7/1973 Gentry .................. 148/511
3,818,412 A * 6/1974 Deardurff ............... 338/214
4,298,794 A * 11/1981 Snitzer et al. ........ 250/227.14
4,737,917 A * 4/1988 Perron ................... 700/205
4,973,911 A * 11/1990 Marshall ................ 324/628
6,281,685 B1 * 8/2001 Tuttle .................... 324/529
6,513,000 B1 * 1/2003 Toda ...................... 703/13
6,811,307 B2 * 11/2004 Crowe et al. ........... 374/131
6,873,160 B1 * 3/2005 Eslambolchi et al. ... 324/523
7,188,406 B2 * 3/2007 Varkey et al. ............ 29/825

FOREIGN PATENT DOCUMENTS

| DE | 36 28 400 | 8/1987 |
| DE | 2 377 760 | 1/2003 |
| EP | 0 734 518 | 10/1996 |
| EP | 0 831 324 | 3/1998 |
| WO | WO 99/61927 | 12/1999 |

OTHER PUBLICATIONS

Patent Abstracts of Japan, vol. 015, No. 206 (C-0835), May 27, 1991 -& JP 03 059129 A (Nakatsu Shiko KK), Mar. 14, 1991 abstract; figures 1,2.

* cited by examiner

*Primary Examiner*—Andrew H Hirshfeld
*Assistant Examiner*—Jeff Natalini
(74) *Attorney, Agent, or Firm*—Young & Thompson

(57) ABSTRACT

A method and device for detecting defects of an electromagnetic protection for an electric harness (H). The device (D) includes elements (M1) for generating stimulating electric signals, elements (M2) for bringing the signals up to a predetermined power level, elements (M3) for applying the signals to the harness (H) and generating an electromagnetic field, elements (M4) for converting the electromagnetic field into thermal field and elements (M5) for detecting a rise in of temperature at a point of the electromagnetic protection defect (DF).

24 Claims, 1 Drawing Sheet

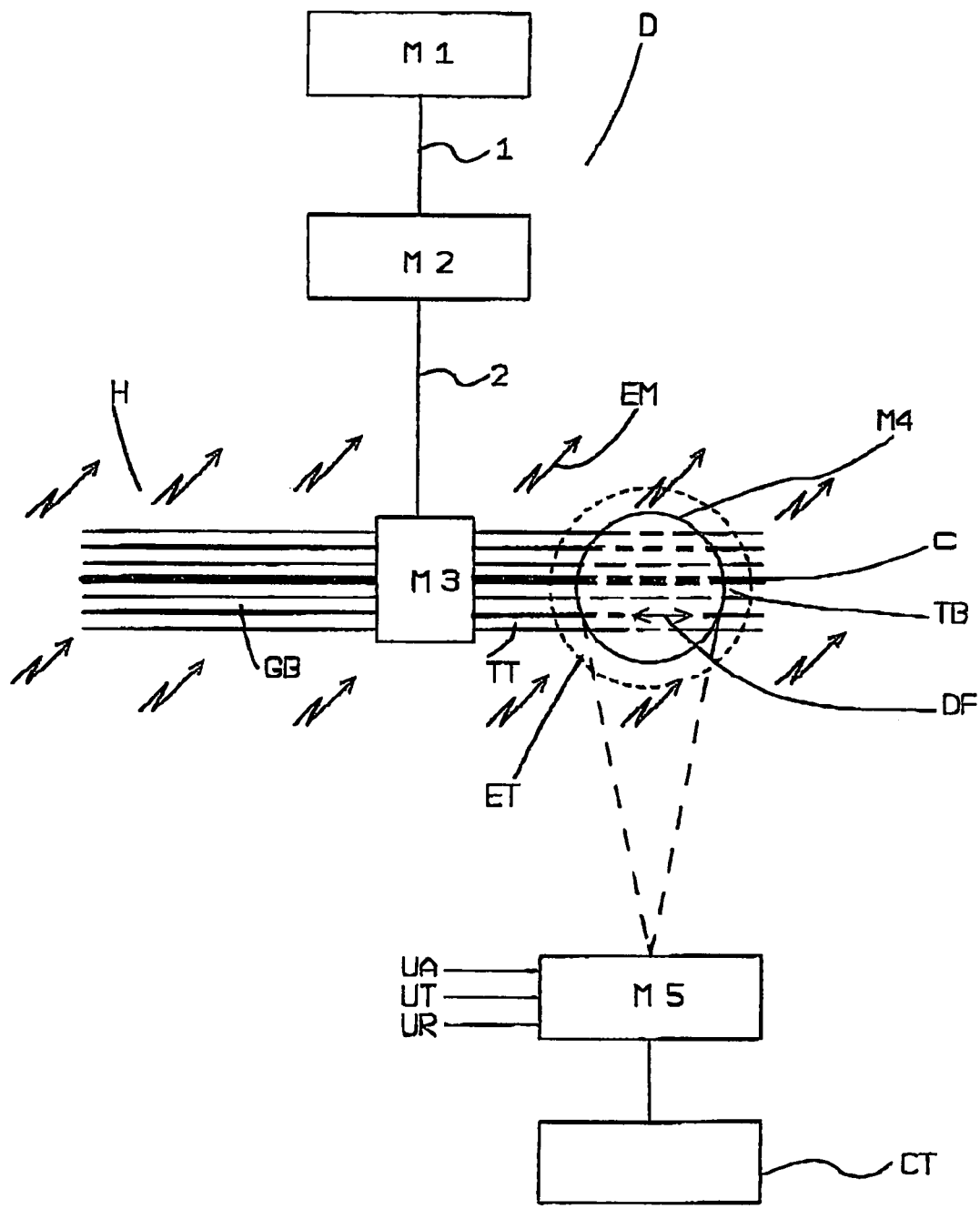
SOLE FIGURE

METHOD AND DEVICE FOR DETECTING DEFECTS OF ELECTROMAGNETIC PROTECTION FOR ELECTRIC HARNESSES

BACKGROUND OF THE INVENTION

The present invention relates to a method and to apparatus for detecting electromagnetic protection defects in electrical conductors, in particular those referred to as "harnesses", namely bundles of electrical conductors that are hardened, i.e. shielded against electromagnetic disturbances, and that are used for electrically interconnecting various devices in a complex electrical installation that needs to function properly, even in the event of electromagnetic disturbances. Naturally, each electrical conductor, constituted by at least one electrically conductive.wire contained in a tube constituting an electrical insulator, may additionally include individual shielding giving it an additional level of protection against electromagnetic disturbances. By way of example, such harnesses are used on board aircraft, ships, tanks, etc. . . . .

DESCRIPTION OF THE RELATED ART

Such harnesses are constituted by a bundle of optionally twisted conductors distributed in a plurality of sub-bundles or branches extending from branching nodes disposed along said bundle, and also by connectors located at the free ends of said branches.

In order to be capable of being shielded against electromagnetic disturbances, also known as electro-magnetic impulses (EMI), said harnesses are covered in metal shielding sheath elements, generally obtained by braiding metal wires to cover said conductors completely and serving to transfer ground or to provide-electrical continuity between the connectors situated at the ends of the harness.

However, under the effect of the vibration to which such harnesses are often subjected, for example, such a shielding sheath presents the drawback of exerting abrasion action on articles that come into contact therewith. Thus, it can wear away the electrical insulation covering the conductors that it surrounds or indeed the shielding sheath of some other harness (or vice versa). Similarly, it can be subjected to abrasive action in contact with other elements situated in its environment. Clearly such abrasive action can lead to malfunctions that are undesirable in installations including said harnesses.

In order to provide hardened harnesses with mechanical protection against rubbing against elements in the environment,. it is known, as described in French patent No. 2,728, 113 and U.S. Pat. No. 6,255,584, to cover the shielding in a textile braid so as to avoid external rubbing and so as to reinforce said mechanical protection by interposing a textile braid between the electrical conductors and the shielding.

Nevertheless, it is found that harnesses can still suffer abrasions and other damage such as stressing, flattening, stretching, impacting, or vibration, with this happening in particular-during handling operations (installing and removing various devices or pieces of equipment in a complex electrical installation).

It is then appropriate for it to be possible to verify as easily as possible the integrity and the quality of the electromagnetic protection of harnesses while the complex electrical installation is in operation.

BRIEF DESCRIPTION OF THE INVENTION

The present invention relates to a solution for checking the electromagnetic protection of harnesses, and it seeks in particular to avoid disconnecting connectors or removing harnesses and also to avoid having recourse to complex. and expensive inspection installations.

Various known solutions exist for verifying the electromagnetic protection of harnesses.

In particular, the following are known:
a) Methods involving local measurements, comprising:
   The method relying on ground loops passing via the shielding sheath. In that method, a first clamp is used to inject current, which clamp is placed on the shielding sheath close to a first end of the harness, and a second clamp or "receiver" is situated on said sheath close to the other end of the harness. That first solution is not very satisfactory since it presents the drawback of detecting a defect in a ground loop without being capable of locating the defect along the harness. In addition, it is capable only of detecting electrical breaks, either concerning the braid wires of the shielding sheath, or between the elements of the connectors. In contrast, it does not spot accidental openings in the braiding of the shielding sheath, since the relative geometrical positions of the wires of the braid does not have any influence on the resistance thereof.
   The method of performing measurement by injecting high frequency alternating current (AC) into the harness and picking up leaks using a magnetic field sensor or an electric field sensor. In practice, the measurement is performed on a disconnected harness by injecting high frequency signals into one of the ends of the harness between one of its internal conductors and the shielding sheath, after placing an electrical resistance between the same two elements at the other end of the harness. A near field sensor (of an electric field or a magnetic field) is then moved along the harness to detect any defect. The advantage of injecting high frequency AC is that it ensures that the measurement involves the transfer impedance of the harness, i.e. a quantity that includes resistive, inductive, and capacitive components, which depend on the geometrical characteristics of the shielding. That method can thus detect an accidental opening in the mesh of the shielding sheath. However a first drawback of that method is that it requires:
      either the connectors to be separated in order to be able to inject AC, which then makes it necessary subsequently to verify that the system is operating properly after the connectors have been reconnected (autotest);
      or else, during manufacture of the harness that is to be inspected, an additional wire to be included specially for injecting AC, thereby necessarily increasing the weight of the harness and requiring special connectors to-be used.
   A second drawback results in the fact that the level of the signal at the measurement location is unknown: all that is known for certain is the level of the signal that is injected. The criterion for detecting a defect is therefore not some threshold value for the field as measured locally, but a value for the-difference between fields measured at two adjacent points. As a result, results are observed to drift over time, thereby making it necessary to broaden acceptance criteria in order to take such uncertainties into account: consequently some defects pass undetected.
b) Methods using overall measurements: the present overall verification method consists in completely illuminating a system or a vehicle in electro-magnetic fields (as described in French patent No. 2,749,940 and U.S. Pat. No. 5,990, 689), in a building that is dedicated to this application, and in using an installation that is complex and poorly compatible with industrial requirements in terms of costs and flexibility. That type of method is capable solely of identifying the existence of defects in the overall system. The locations and the natures of the defects can then be determined only by having recourse to the methods as described above.

Thus, although it is generally possible to determine without too much difficulty that a defect such as an accidental opening in a shielding sheath of a harness does indeed exist, it is often difficult or even impossible to locate it in a complex electrical installation without having to disassemble the installation in part or in full.

Thus, an object of the present invention is to remedy those drawbacks. The invention relates to a method and apparatus making it possible accurately, at low cost, and without disassembly, to locate electro-magnetic protection defects, in particular accidental openings in harness shielding sheaths, forming part of a complex electrical installation, regardless of its complexity, and in particular in an aircraft.

According to the invention, the method of locating an electromagnetic protection defect in an electrical harness including. at least one electromagnetic shielding sheath is remarkable in that it comprises:

a) an amplification step of producing stimulation electrical signals in an operating frequency range and at a predetermined power level;

b) an application step of applying said stimulation electrical signals to said shielding sheath in order to generate an electromagnetic field in a detection zone; and c) an analysis step of taking temperature measurements in said detection zone.

Thus, by means of the invention, the method of detecting an electromagnetic protection defect in a harness shielding sheath is based on "exciting the defect" by means of a stimulation electrical signal that generates an electromagnetic field inside the harness. A defect that corresponds to an accidental opening in the shielding sheath in the zone where the defect is located behaves like a radiating antenna. The way the radiant energy emitted by the electromagnetic field through the defect becomes transformed into thermal energy makes it possible to locate said defect by detecting a maximum temperature zone on a temperature map at the location of the defect.

It should be recalled that step a) of the method requires stimulation electrical signals to be generated at high frequency, since the radiation around a defect becomes more intense with increasing frequency.

Furthermore, it should be observed that step a) advantageously requires the stimulation electrical signals to be amplified so as to bring them up to a predetermined power level, in order to obtain an electro-magnetic field that is sufficiently strong.

Advantageously, said method does not depend on any exclusive type of harness, and as a result it can be implemented without being limited to such specific applications, and it can be used advantageously simultaneously with a plurality of adjacent harnesses.

In particular, implementing step b) of the method enables the radiant energy emitted by the electromagnetic field via a defect to be converted into thermal energy either outside a harness or else in the textile braids, or indeed in the shielding itself.

While enabling the precision with which an electro-magnetic protection defect in a harness can be located by performing the analysis of step c), the invention is also particularly suited to inspecting harnesses since it does not require partial or complete disconnection of their components, thereby contributing to improving the safety of a complex electrical installation.

Thus, the invention makes it possible to reduce the time required for inspecting a complex electrical installation, thereby obtaining a method that is very effective, while presenting an operating cost that is lower than that of known solutions.

The present invention also relates to apparatus for implementing the above-specified method. According to the invention, said apparatus is remarkable in that it comprises:

a) means for generating stimulation electrical signals in an operating frequency range;

b) means for amplifying said stimulation electrical signals in order to raise them to a predetermined power level;

c) means for applying said stimulation electrical signals to said shielding sheath in order to generate an electromagnetic field;

d) means for converting the radiant energy emitted by the electromagnetic field at a defect into thermal energy; and e) means for drawing up a temperature map, including elements for detecting thermal energy, combined with units for acquisition, storage, and image-processing, in order to perform temperature analysis and locate an electromagnetic protection defect in the shielding sheath of a harness.

BRIEF DESCRIPTION OF THE DRAWING

The sole FIGURE of the accompanying drawing helps understand one possible embodiment of the invention amongst others. The sole FIGURE is a block diagram of apparatus in accordance with the invention.

DESCRIPTION OF THE PREFERRED EMBODIMENTS

The apparatus in accordance with the invention that is shown diagrammatically in the FIGURE is for locating electromagnetic protection defects in the shielding sheath GB (placed around an electrically conductive wire C contained in a tube TB providing electrical insulation) of a harness H forming part of a complex electrical installation (not shown), e.g. an installation on board an aircraft or a helicopter. An electromagnetic protection defect DF is symbolized by a double-headed arrow in the above-specified FIGURE. For this purpose, said apparatus D comprises:

first means M1 for generating stimulation electrical signals in an operating frequency range;

second means M2 connected to the first means M1 via a link 1, for amplifying said stimulation electrical signals and for bringing them up to a predetermined power level;

third means M3 connected to the second means M2 via a link 2, for applying said stimulation electrical signals to said shielding sheath GB so as to generate an electromagnetic field EM;

fourth means M4 for converting the radiant energy emitted by the electromagnetic field EM at a defect. DF into thermal energy ET; and fifth means M5 for detecting the thermal energy ET and combined with an acquisition and an image storage unit UA, an image processor unit UT, and an image display unit UR for performing temperature analysis, drawing up a temperature map CT, and locating on said temperature map the electromagnetic protection defect DF in said shielding sheath GB of the harness H.

The first means M1 constitutes the first element of the excitation system for exciting an electromagnetic protection defect, if any, in the shielding sheath GB of a harness H. These first means M1 generate stimulation electrical signals at high frequency.

For this purpose, the operating frequencies advantageously lie in the range about 100 megahertz (MHz) to about 20 gigahertz (GHz), and the magnitude of the electric current is of the order of about 10 milliamps (mA) for a frequency of about 100 MHz. Nevertheless, a frequency range that provides a good compromise in terms of results and costs, is 1 GHz to 5 GHz, and in particular 2 GHz to 3 GHz, the equipment cost generally increasing as a function of the operating frequency.

Furthermore, according to the invention, the electrical signals are preferably of the sinewave type, since this type of electrical signal is adapted to the high frequency range.

The second means M2 is the second element in the system for exciting an electromagnetic protection defect, if any, in the shielding sheath GB of a harness H. It is constituted by an amplifier for amplifying said stimulation electrical signals so as to bring them up to a predetermined power level. In practice, it is preferable for said stimulation electrical signals to be current-amplified. Since the stimulation electrical signals produced by the generator M1 are of low current, it is necessary to amplify them in order to produce an electromagnetic field that is sufficiently strong to be able to induce electric currents of the order of 40 mA to 150 mA in shielding.

The third means M3 enables said stimulation electrical signals to be applied to the shielding sheath GB, thus completing the system for exciting a defect, if any. Advantageously, the third means M3 comprise an induction clamp (known in itself), essentially constituted by a coil for generating an electromagnetic field EM when the coil carries an electric current, and for this purpose it suffices for the induction clamp merely to be pressed against the harness.

According to the invention, in addition to said system for exciting an electromagnetic protection defect, if any, in a shielding sheath GB of a harness H, the apparatus further comprises a detection system that includes fourth means M4.

The fourth means M4 comprise a specific detector for converting the radiant energy emitted by the electro-magnetic field EM generated in the shielding sheath GB into thermal energy ET, in particular by Joule effect absorption of thermal losses. The material or main component of such means M4 is referred to below as being photothermal.

Naturally, the thermal energy ET takes on a maximum value simultaneously with the electromagnetic energy EM, i.e. specifically at the position of the lack of electro-magnetic protection in the shielding sheath GB, since an accidental opening in said shielding sheath behaves like an antenna radiating the electromagnetic field EM.

For this purpose, said fourth means M4 is advantageously constituted by a photothermal film that is 50 micrometers (μm) to 100 μm thick, and responsive to an electromagnetic field. It is constituted by a resistive layer that is vacuum-deposited on an insulating substrate, e.g. of plastics material. By moving this film over the harness H, the radiated electromagnetic field ET heats up the resistive layer, in particular by the Joule effect, and thus enables a hot spot to be identified at a defect in the electromagnetic protection of said shielding sheath GB.

In a simplified embodiment, a flexible photothermal film is used as produced by the supplier Dupont de Nemours® under the name Kapton® XC Black Conductive which is constituted by a Kapton substrate covered in a resistive layer of "conductive carbons".

In a particularly advantageous embodiment, the layer of conductive carbons is deposited directly on the entire outside surface of the H using a spray, for example. As a result, the harness acts as the substrate. As mentioned above, the outside surface of a harness is generally constituted by a braided textile sheath TT made, for example, of fibers known under the name Nomex®. Since, for proper operation of the apparatus, it is preferable for the thickness of the deposit to be regular, it is advantageous for the fibers to be treated individually prior to being braided.

In another embodiment, the conductive carbons are applied to the metal braiding wires of the shielding sheath GB of the harness H, given that experience has shown that the presence of the outer textile sheath TT does not affect the sensitivity of the device.

Since the deposit of carbon particles ("resistive carbons") constitutes an electrically conductive material, a particular variant uses a single textile sheath TT for providing electromagnetic protection, said single sheath being covered in resistive carbons and surrounding the electrical bundle, thus making it possible to omit the metal braid and achieve a significant saving in weight, e.g. of several tens of percent of the total weight of a harness.

In addition, it is also possible to envisage using resistive carbons inside the fibers of the textile braid TT which, for this purpose, should be hollow, thereby serving to protect the deposit of resistive carbons.

Naturally, the resistive carbons could be replaced by any other equivalent component or material that is photothermal as defined above.

In the invention, while moving the fourth means M4 without contact along the harness, variations in the temperatures detected by the fourth means M4 are recorded by temperature-sensitive fifth means M5 that complete the detection system, e.g. a camera suitable for being displaced along the harness H.

When the photothermal material is deposited directly on one of the elements of the harness (on the outside or inside of the textile braid TT, or on the metal wires of the shielding sheath GB), then it is naturally only the camera that is moved.

According to the invention, the fifth means M5 are preferably constituted by an infrared thermal camera combined with an image acquisition and storage unit UA, an image processor unit UT, and an image replay unit UR for displaying the image on a display screen or for printing it on a suitable medium.

Thus, the field defined by the objective lens of the camera on the fourth means M4 constitutes a detection zone.

Naturally, the apparatus D enables a plurality of adjacent harnesses to be inspected simultaneously, firstly because the fifth means MS is outside the complex electrical installation, and secondly either because of the lack of contact between the fourth means M4 and one or more adjacent harnesses, or else because the resistive carbons or an equivalent component or material is/are integrated directly in one or more adjacent harnesses.

Thus, the information delivered by the infrared camera can be processed to draw up an infrared map of the surface under analysis.

In order to enable an operator to make use of such a map, the range of temperatures is converted into a palette of "false" colors in conventional manner so that any zone that. lies within predetermined temperature limits are viewed as having a corresponding color.

Naturally, -shielding in good condition produces an image that is substantially uniform in color. In contrast, the presence of an electromagnetic protection defect in the shielding sheath leads to the appearance of a plurality of colors, such that the criterion for rejecting harness under inspection (the presence of at least one defect) corresponds to a predetermined temperature difference associated with a certain range of colors, depending on the sensitivity of the overall apparatus and on the desired quality level.

Nevertheless, it is necessary to perform a correction in order to exclude the effects of the environment on the temperature map. Since the harness is analyzed while it is in its operating environment, the resulting temperature image can be disturbed by the presence of pieces of equipment, equipment supports, and other harnesses. Thus, a harness in good condition does not produce an image that is completely uniform in certain environments, and that might lead to defects being suspected where there are none.

In addition, making use of an infrared camera requires the colors to be initially calibrated so that said camera operates in a range of colors that corresponds to its greatest sensitivity. For this purpose, a first image is taken using a wide-angle view of the overall zone to be inspected, and the camera is adjusted so that the background color corresponds to the best sensitivity color of the camera. Thereafter, precise zones of the cabling under inspection are examined using narrow fields of view.

Known computer means for processing images serve to further improve the quality of the images obtained by eliminating certain kinds of disturbances, where present.

Consequently, it should be observed that the present invention also provides additional features that are essential for satisfying industrial and economic requirements, and in particular:

the use of a camera makes it possible for the information to be stored. It is thus possible to build up a database for all of the cabling in a vehicle so that the state of cabling at a given moment can be compared objectively with some initial reference state, in particular the state of the cabling when new;

image processing software is associated with the camera. It is possible in particular to calibrate the scale for converting a temperature range into a palette of colors so that all the images present the same background color regardless of the temperature environment of the cabling. Comparison then becomes objective. It is also possible to select the sensitivity of the graphical display: a given range of colors may correspond to smaller or larger temperature differences depending on the selected adjustment. Thus, all types of processing are possible insofar as the digital images from the camera are processed by a computer.

Consequently, the method and the apparatus of the invention also present the following advantages:

reliability: software processing provides better reproducibility and objectivity than can be provided by an operator;

traceability: the database is available; and adaptability: image processing depending on requirements.

Furthermore, while reducing the operating and action costs involved with verifying the electromagnetic protection provided by the shielding sheath of electrical harnesses, it should be observed that implementing the invention is particularly advantageous since it makes it possible to avoid vehicles being taken out of operation for lengthy and expensive periods of time (in particular in the field of aviation where the vehicles are airplanes, helicopters, . . . ), and it also provides improved safety.

As mentioned above, the above-described embodiment and implementation are not limiting and serve solely to illustrate the wide variety of applications and implementations that are possible for the apparatus and method of the invention.

Because of these characteristics, said apparatus and said method of the invention can be applied to harnesses H of the following types:

a first type of harness H comprising, within an electrically insulating tube TB, at least one electrical conductor C, the tube being provided with a protective covering including a screen of photothermal material;

a second type of harness H comprising, within at least one electrically insulating tube TB, at least one electrical conductor C, the tube being provided with a protective covering comprising a textile braid TT having said screen of photothermal material deposited thereon;

a third type of harness H in which the fibers of the textile braid H are hollow and contain said photothermal material therein; and a fourth type of harness H such that said protective covering comprises a shielding sheath GB constituted by a metal braid having said screen of photothermal material applied thereto.

Furthermore, each of the above types of harness may comprise a plurality of electrically insulating tubes (each around at least one electrical conductor C), these tubes being covered in a single protective covering including a screen of photothermal material.

Similarly, the protective covering of photothermal material may cover a plurality of adjacent harnesses.

Preferably, the electrically conductive and/or photothermal material is essentially constituted by so-called "resistive carbons".

The invention claimed is:

1. A method of locating an electromagnetic protection defect (DF) in an electrical harness (H) including at least one sheath of electromagnetic shielding (GB), the method comprising:

a) an amplification step of producing stimulation electrical signals in an operating frequency range and at a predetermined power level;

b) an application step of applying said stimulation electrical signals to said shielding sheath of electromagnetic shielding in order to generate an electromagnetic field in a detection zone; and c) an analysis step of taking temperature measurements in said detection zone, drawing up a map of the temperatures that result from radiant energy being emitted by the electromagnetic field via a defect of the harness and being converted into heat, and locating the defect of the harness on the map.

2. A method according to claim 1, wherein the frequency of said stimulation electrical signals lies in the range 1 GHz to 5 GHz.

3. A method according to claim 1, wherein said stimulation electrical signals are of the sinewave type.

4. A method according to claim 1, wherein, said detection zone is close to said shielding sheath (GB), and the located defect is an electromagnetic protection defect located within said electrical harness comprising said shielding sheath of electromagnetic shielding, said shielding sheath absorbing the energy of the electromagnetic field.

5. A method according to claim 1, the method being implemented on said harness (H) having its shielding sheath (GB) constituted by a textile braid (TT) on which a layer of a material has previously been deposited, the material absorbing electromagnetic field energy, and the located defect is an electromagnetic protection defect located within the harness, said shielding sheath absorbing the energy of the electromagnetic field, said harness being connected to an equipment, without disconnecting the equipment.

6. A method according to claim 5, wherein the material contains carbon particles.

7. A method according to claim 1, the method being implemented on said harness (H) having its shielding sheath (GB) constituted by a textile braid (TT) with hollow fibers containing a material absorbing electromagnetic field energy.

8. A method according to claim 7, wherein the material contains carbon particles.

9. A method according to claim 1, the method being implemented on said harness (H) having its shielding sheath (GB) constituted by a braid of metal wires onto which a material is applied, the material absorbing electromagnetic field energy.

10. A method according to claim 9, wherein .the material contains carbon particles.

11. A method according to claim 1, the method being implemented on a plurality of adjacent harnesses.

12. Apparatus for locating an electromagnetic protection defect (DF) in an electrical harness (H) including at least one sheath of electromagnetic shielding (GB), the apparatus comprising:

first means (M1) for generating stimulation electrical signals in an operating frequency range at a predetermined power level;

second means (M2) connected to the first means (M1) via a link (1) for raising said stimulation electrical signals to a predetermined power level;

third means (M3) connected to the second means (M2) via a link (2), for applying said stimulation electrical signals to the shielding sheath (GB) of electromagnetic shielding in such a manner as to generate an electromagnetic field (EM);

fourth means (M4) for converting the radiant energy emitted by the electromagnetic field (EM) at a defect into thermal energy (ET); and fifth means (M5) for detecting the thermal energy and associated with an image acquisition and storage unit (UA), an image processor unit (UT), and an image display unit (UR) in order to perform thermal analysis, draw up a temperature map (CT), and locate on said temperature map the electromagnetic protection defect (DF) of said shielding sheath (GB) of the harness (H), the located defect being an electromagnetic protection defect located within the harness, said shielding sheath absorbing the energy of the electromagnetic field, said harness being connected to an equipment, without disconnecting the equipment.

13. Apparatus according to claim 12, wherein the fourth means (M4) comprises an electrically conductive material absorbing electromagnetic field energy.

14. Apparatus according to claim 13, wherein said electrically conductive material contains carbon.

15. Apparatus according to claim 13, wherein the fourth means is external to said harness (H) and comprises a flexible film on which the electrically conductive material has been deposited.

16. Apparatus according to claim 15, wherein said electrically conductive material contains carbon particles.

17. Apparatus according to claim 12, wherein the fifth means (M5) comprise an infrared camera.

18. Apparatus according to claim 12, including means for drawing up a temperature map (CT) in the form of a false color display, each color representing a predetermined temperature difference.

19. Apparatus according to claim 18, wherein a criterion for rejecting said harness (H) corresponds to a predetermined range of colors.

20. A method of locating an electromagnetic protection defect (DF) in an electrical harness (H) including at least one sheath of electromagnetic shielding (GB), the method comprising:

a) an amplification step of producing stimulation electrical signals in an operating frequency range and at a predetermined power level;

b) an application step of applying said stimulation electrical signals to said shielding sheath of electromagnetic shielding in order to generate an electromagnetic field in a detection zone; and c) an analysis step of taking temperature measurements in said detection zone, drawing up a map of the temperatures that result from radiant energy being emitted by the electromagnetic field via a defect of the harness and being converted into heat, and locating the defect on the map, wherein the temperature range of said temperature map is converted into a palette of colors.

21. A method according to claim 20, wherein the frequency of said stimulation electrical signals lies in the range 1 GHz to 5 GHz.

22. A method according to claim 21, wherein said stimulation electrical signals are of the sinewave type.

23. A method according to claim 21, wherein, said detection zone is close to said shielding sheath (GB).

24. A method according to claim 21, wherein a predetermined range of colors defines a rejection criterion whereby the harness (H) is determined as suffering from at least one electromagnetic protection defect.

* * * * *